(12) United States Patent
Strasser et al.

(10) Patent No.: US 11,161,735 B2
(45) Date of Patent: Nov. 2, 2021

(54) DOUBLE-MEMBRANE MEMS COMPONENT AND PRODUCTION METHOD FOR A DOUBLE-MEMBRANE MEMS COMPONENT

(71) Applicant: Infineon Technologies AG, Neubiberg (DE)

(72) Inventors: Johann Strasser, Schierling (DE); Alfons Dehe, Villingen Schwenningen (DE); Gerhard Metzger-Brueckl, Geisenfeld (DE); Juergen Wagner, Nittendorf (DE); Arnaud Walther, Unterhaching (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/850,560

(22) Filed: Apr. 16, 2020

(65) Prior Publication Data

US 2020/0239302 A1 Jul. 30, 2020

Related U.S. Application Data

(62) Division of application No. 16/118,055, filed on Aug. 30, 2018, now Pat. No. 10,669,151.

(30) Foreign Application Priority Data

Sep. 1, 2017 (DE) .......................... 102017215381.4

(51) Int. Cl.
*B81B 7/02* (2006.01)
*B81B 3/00* (2006.01)
(Continued)

(52) U.S. Cl.
CPC .............. *B81B 7/02* (2013.01); *B81B 3/0018* (2013.01); *B81C 1/00158* (2013.01);
(Continued)

(58) Field of Classification Search
CPC ..... B81C 1/00182; B81C 2201/00–117; B81B 7/02
See application file for complete search history.

(56) References Cited

U.S. PATENT DOCUMENTS

2004/0175510 A1* 9/2004 Hattori ................... G11B 5/855
427/454
2011/0111545 A1 5/2011 El-Gamal
(Continued)

FOREIGN PATENT DOCUMENTS

DE 102005029802 A1 1/2007
DE 102015103059 A1 9/2015
KR 20150002539 A 1/2015

*Primary Examiner* — Dale E Page
*Assistant Examiner* — Wilner Jean Baptiste
(74) *Attorney, Agent, or Firm* — Slater Matsil, LLP

(57) ABSTRACT

A production method for a double-membrane MEMS component includes: providing a layer arrangement on a carrier substrate, wherein the layer arrangement comprises a first membrane structure, a sacrificial material layer adjoining the first membrane structure, and a counterelectrode structure in the sacrificial material layer and at a distance from the first membrane structure, wherein at least one through opening is formed in the sacrificial material layer as far as the first membrane structure; forming a filling material structure in the at least one through opening by applying a first filling material layer on the wall region of the at least one through opening; applying a second membrane structure on the layer arrangement with the sacrificial material; and removing the sacrificial material from an intermediate region to expose the filling material structure in the intermediate region.

18 Claims, 8 Drawing Sheets

(51) Int. Cl.
*H04R 19/04* (2006.01)
*H04R 31/00* (2006.01)
*H04R 19/00* (2006.01)
*B81C 1/00* (2006.01)

(52) U.S. Cl.
CPC ....... *B81C 1/00182* (2013.01); *H04R 19/005* (2013.01); *H04R 19/04* (2013.01); *H04R 31/003* (2013.01); *B81B 2201/0257* (2013.01); *B81B 2203/0127* (2013.01)

(56) References Cited

U.S. PATENT DOCUMENTS

| | | |
|---|---|---|
| 2015/0251899 A1 | 9/2015 | Dehe et al. |
| 2018/0086627 A1 | 3/2018 | Lin et al. |
| 2018/0091906 A1 | 3/2018 | Khenkin et al. |

\* cited by examiner

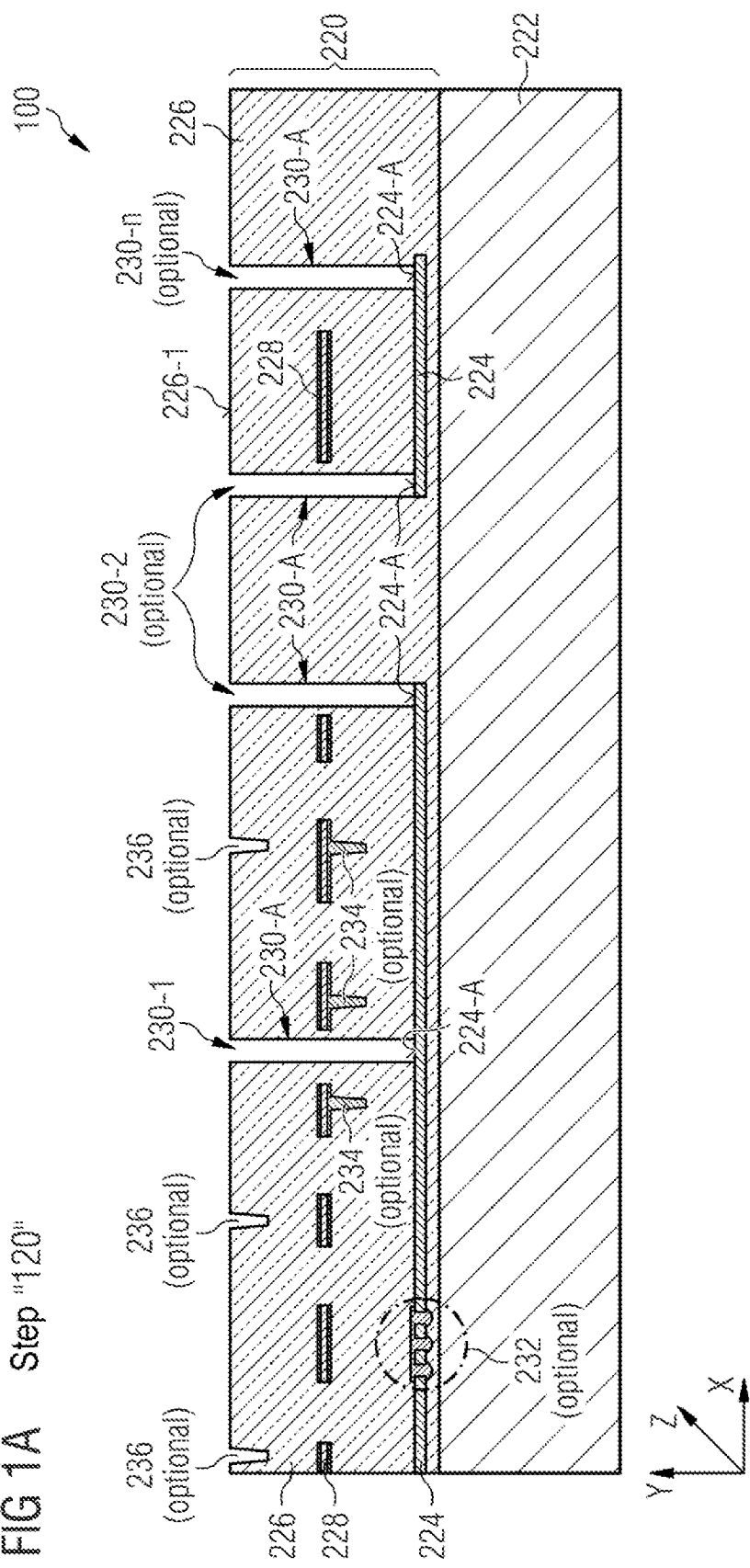

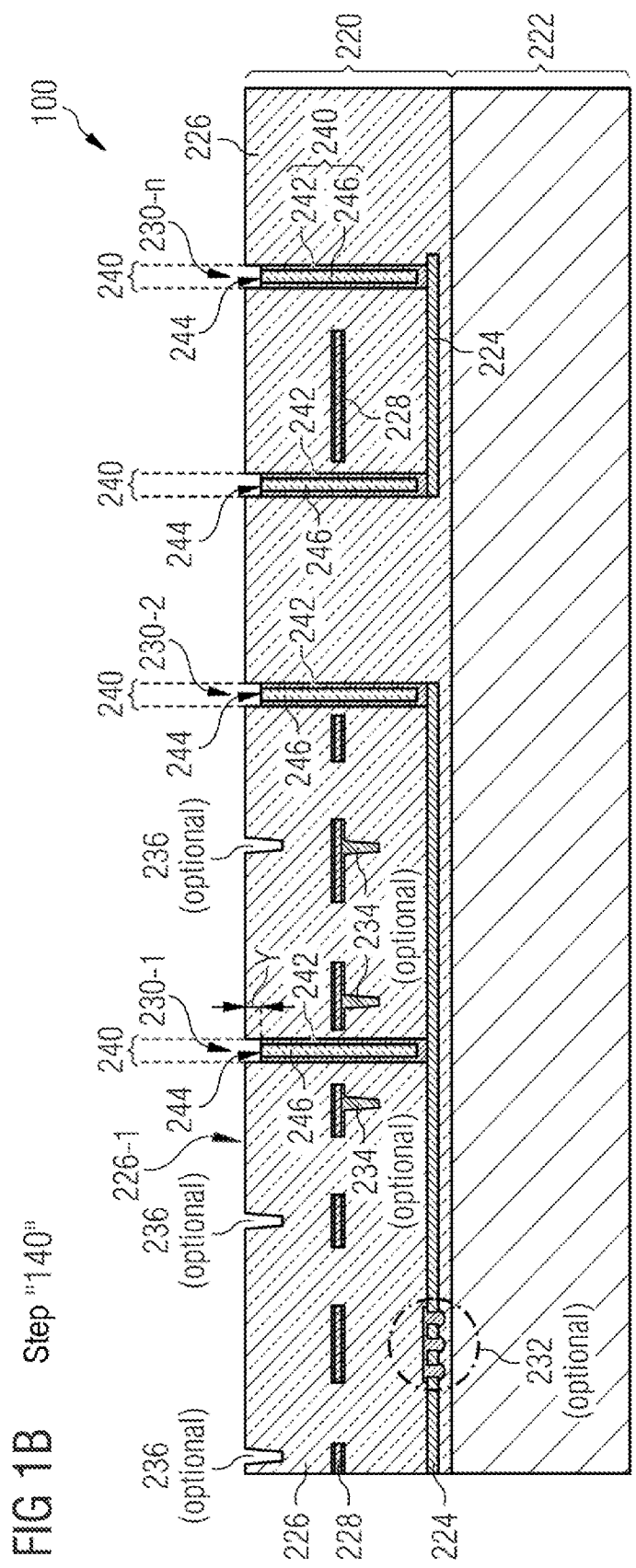
FIG 1B Step "140"

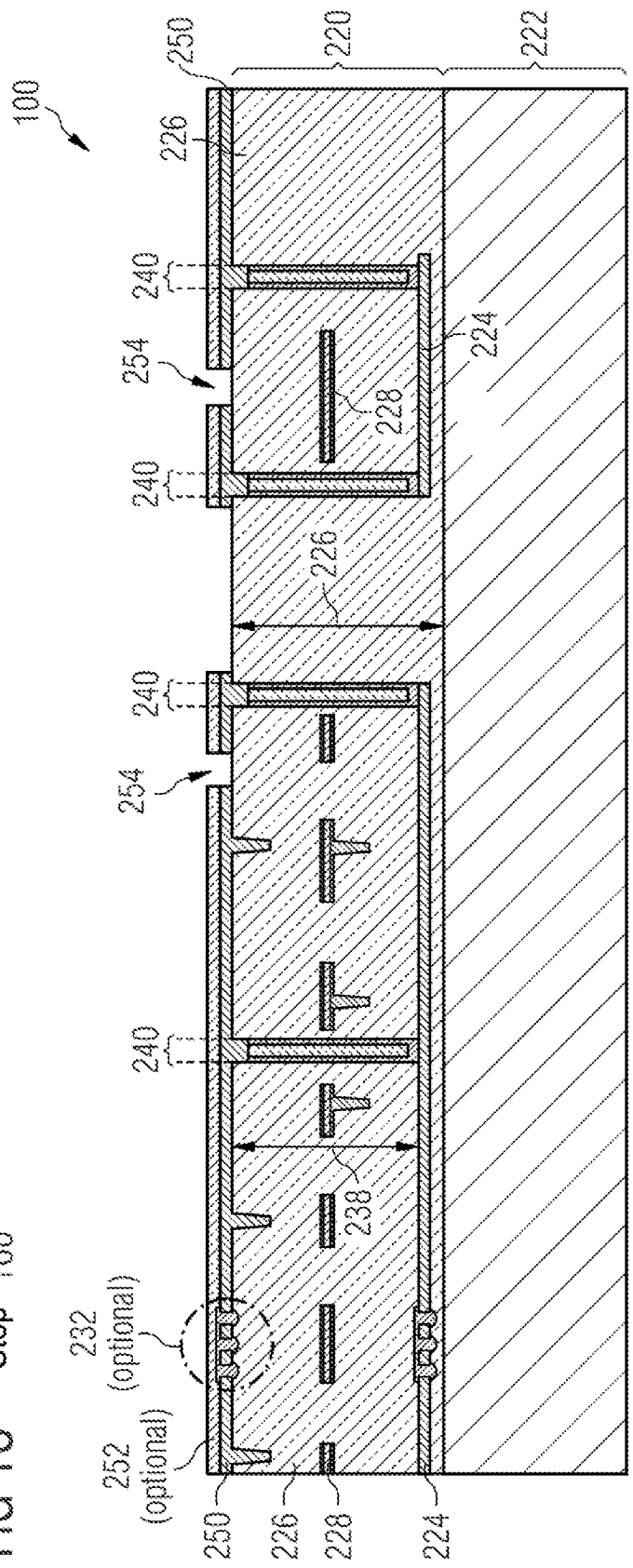
FIG 1C  Step "160"

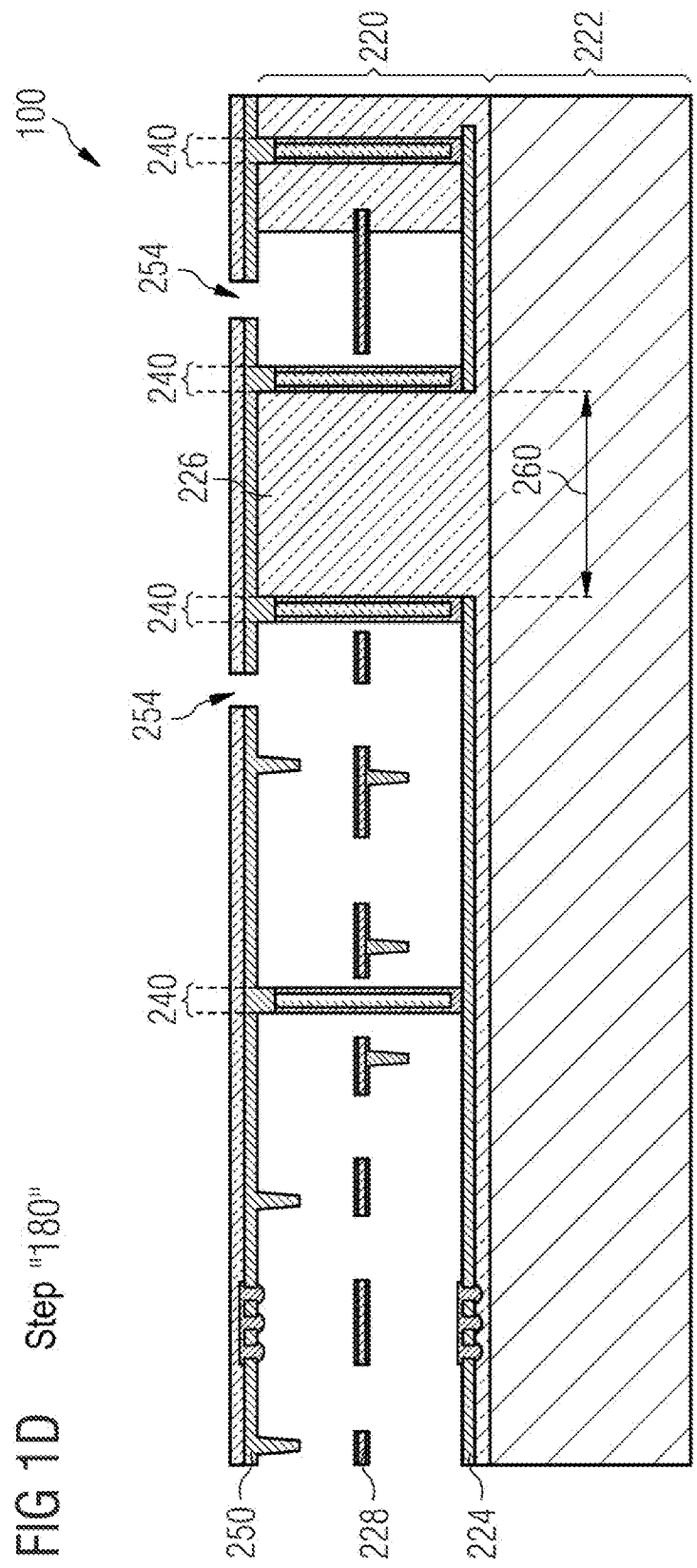

DOUBLE-MEMBRANE MEMS COMPONENT AND PRODUCTION METHOD FOR A DOUBLE-MEMBRANE MEMS COMPONENT

This application is a divisional of U.S. patent application Ser. No. 16/118,055, filed Aug. 30, 2018, which application claims the benefit of German Patent Application No. 102017215381.4, filed on Sep. 1, 2017, which applications are hereby incorporated herein by reference in its entirety.

TECHNICAL FIELD

Exemplary embodiments relate to a double-membrane MEMS component and to a production method for a double-membrane MEMS component, such as e.g. a MEMS pressure transducer, an acoustic MEMS sensor or a MEMS sound transducer in the form of MEMS microphones or MEMS loudspeakers. Exemplary embodiments relate in particular to acoustic MEMS sensors in the form of double-membrane MEMS microphones comprising dielectric, columnar, mechanical connection elements between the two spaced-apart membrane structures.

BACKGROUND

Acoustic MEMS sensors, such as e.g. MEMS microphones, are exposed to the surrounding atmosphere in a manner governed by their function and are thus often also exposed to contaminants, such as e.g. particles, liquids, moisture, etc. In order that said contaminants do not lead to a malfunction or to a reduced performance of the acoustic MEMS sensors, these acoustic MEMS sensors are protected by complex grilles and special ports within the application, e.g. within a mobile device. However, the acoustic behavior of the sensors ought not to be impaired by the mechanical protection elements and the specific construction of the acoustic MEMS sensors, that is to say that the intention is to maintain the highest possible signal-to-noise ratio (SNR) of the sensor output signal.

SUMMARY

In accordance with one exemplary embodiment, a production method for a double-membrane MEMS component comprises the following steps: providing a layer arrangement on a carrier substrate, wherein the layer arrangement comprises a first membrane structure, a sacrificial material layer adjoining the first membrane structure, and a counterelectrode structure in the sacrificial material layer and at a distance from the first membrane structure, wherein in the sacrificial material layer at least one through opening is formed as far as the first membrane structure and in a manner separated from the counterelectrode structure; forming a filling material structure in the through opening by applying a first filling material layer on the wall region of the through opening in order to obtain an inner volume region in the through opening adjoining the first filling material layer; applying in a structured manner a second membrane structure on the layer arrangement with the sacrificial material and the filling material structure in order to hermetically seal the inner volume region, wherein the counterelectrode structure is arranged in an intermediate region, filled with the sacrificial material, between the first and second membrane structures and in each case at a distance from same; and removing the sacrificial material from the intermediate region in order to expose the filling material structure in the intermediate region, in order to obtain at least one mechanical connection element between the first and second membrane structures, which is mechanically coupled between the first and second membrane structures and is mechanically decoupled from the counterelectrode structure.

In accordance with one exemplary embodiment, a second filling material can be introduced into the inner volume region in order to obtain the filling material structure, wherein the second filling material is different than the first filling material.

In accordance with one exemplary embodiment, a layer sequence comprising a plurality of filling material layers can be introduced into the inner volume region in order to obtain the filling material structure, wherein at least one further filling material layer comprises a second filling material different than the first filling material layer.

In accordance with one exemplary embodiment, the material of the first filling material layer has a higher modulus of elasticity than the material of the second filling material layer.

In accordance with one exemplary embodiment, the first filling material layer comprises a nitride material, and wherein the second filling material layer comprises an oxide material.

In accordance with one exemplary embodiment, the filling material structure is formed in frustoconical, cylindrical or funnel-shaped fashion between the first and second membrane structures.

In accordance with one exemplary embodiment, a step of removing the sacrificial material is carried out by means of an isotropic etching process using a liquid or gaseous etchant or reactant, wherein the etchant has an etching rate which is higher for the sacrificial material than for the first filling material at least by a factor of 10.

In accordance with one exemplary embodiment, a step of removing the sacrificial material is carried out by means of a reactant that forms gaseous products with the sacrificial layer, wherein the reactant has a reaction rate which is higher for the sacrificial material than for the first filling material at least by a factor of 10.

In accordance with one exemplary embodiment, before the step of providing the layer arrangement, the following steps for forming the layer arrangement are carried out: forming the first membrane structure in the form of a first membrane layer or a first membrane layer stack on the carrier substrate, applying sacrificial material on the first membrane structure, forming the counterelectrode structure in the form of a counterelectrode layer or a counterelectrode layer stack on the applied sacrificial material, applying sacrificial material 226 on the counterelectrode structure, and introducing the at least one through opening into the sacrificial material as far as the first membrane structure and in a manner separated from the counterelectrode structure.

In accordance with one exemplary embodiment, the step of introducing involves introducing a plurality of through openings into the sacrificial material as far as the first membrane structure, wherein the filling material structure is formed in the plurality of through openings, and wherein the step of removing the sacrificial material involves exposing the filling material structure in the plurality of through openings in order to obtain a plurality of mechanical connection elements between the first and second membrane structures, which are mechanically coupled between the first and second membrane structures and are mechanically decoupled from the counterelectrode structure.

In accordance with one exemplary embodiment, furthermore the first membrane structure is incipiently etched in the region of the at least one through opening in order to obtain a depression in the material of the membrane structure in the region of the at least one through opening, wherein the step of incipiently etching the membrane structure is performed during the process of introducing or subsequently to the process of introducing the at least one through opening into the sacrificial material as far as the first membrane structure and before the process of forming the filling material structure.

In accordance with one exemplary embodiment, furthermore the first and second membrane structures are hermetically sealed under reduced atmospheric pressure or vacuum in order to generate a reduced atmospheric pressure or vacuum in the intermediate region between the first and second membrane structures of the double-membrane MEMS component.

In accordance with one exemplary embodiment, a double-membrane MEMS component comprises a layer arrangement on a carrier substrate, wherein the layer arrangement comprises a first and second membrane structure at a distance from one another and a counterelectrode structure arranged therebetween, said counterelectrode structure being at a distance in each case from the first and second membrane structures, and at least one mechanical connection element between the first and second membrane structures, which is mechanically coupled between the first and second membrane structures and is mechanically decoupled from the counterelectrode structure, wherein the at least one mechanical connection element comprises a material structure having a first filling material layer as wall region of the mechanical connection element, wherein the filling material layer formed as wall region forms an inner volume region in the mechanical connection element, and wherein a medium is arranged in the inner volume region of the mechanical connection element, wherein the medium has a lower modulus of elasticity than the material of the first filling material layer forming the wall region.

In accordance with one exemplary embodiment, the mechanical connection element 20 is formed as a hollow body or empty tube.

In accordance with one exemplary embodiment, a second filling material is arranged in the inner volume region, wherein the second filling material 246 is different than the material of the first filling material layer.

In accordance with one exemplary embodiment, the filling material structure comprises a layer sequence comprising a plurality of filling material layers in the inner volume region, wherein at least one further filling material layer comprises a filling material different than the material of the first filling material layer.

In accordance with one exemplary embodiment, the material of the first filling material layer has a higher modulus of elasticity than the material of the further filling material layer.

In accordance with one exemplary embodiment, the first filling material layer comprises a nitride material, and wherein the second filling material layer comprises an oxide material.

In accordance with one exemplary embodiment, the filling material structure is formed in frustoconical, cylindrical or funnel-shaped fashion between the first and second membrane structures.

BRIEF DESCRIPTION OF THE DRAWINGS

Exemplary embodiments of devices and/or methods are explained in greater detail below by way of example with reference to the accompany drawings, in which:

FIGS. 1a-1d show a schematic illustration of an exemplary method for producing a double-membrane MEMS component in accordance with one exemplary embodiment;

DETAILED DESCRIPTION OF ILLUSTRATIVE EMBODIMENTS

Figure 2A:
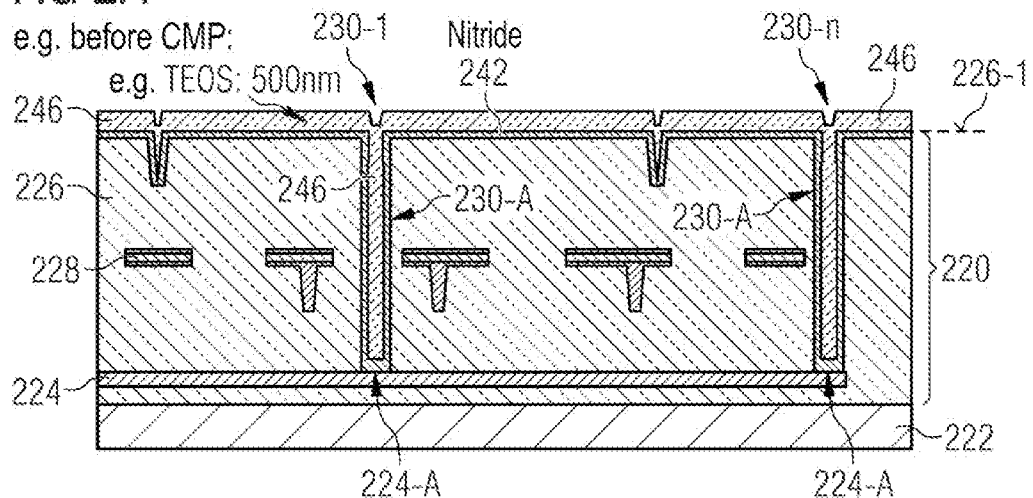
FIGS. 2a-2c show exemplary method steps for forming a filling material structure for mechanical connection elements of the double-membrane MEMS component in accordance with one exemplary embodiment.

Before exemplary embodiments of the present concept are explained in more specific detail below with reference to the drawings, it is pointed out that identical, functionally identical or identically acting elements, objects, function blocks and/or method steps in the various figures are provided with the same reference signs, such that the description of said elements, objects, function blocks and/or method steps with the same reference signs that is presented in various exemplary embodiments is mutually interchangeable or can be applied to one another.

Various embodiments are directed to MEMS components, such as e.g. acoustic MEMS sensors, and for a corresponding production method with which an acoustic MEMS sensor having the best possible acoustic behavior and also at the same time having effective particle protection, i.e. mechanical protection of the gap between movable membrane and backplate, can be obtained.

Acoustic MEMS sensors, such as e.g. MEMS microphones, are usually constructed as a sequence of layers comprising a silicon material, silicon nitride material and silicon oxide material. The silicon material can be present e.g. as polycrystalline silicon (polysilicon) or as monocrystalline silicon. The stated materials should be assumed to be merely by way of example, wherein other semiconductor materials such as the silicon material described and other insulation materials such as the nitride material and oxide material described can also be used provided that the corresponding material properties can be maintained. In order to simplify the following description, however, reference is made by way of example to silicon as semiconductor material and to nitride and oxide as insulating materials. By way of example, carbon e.g. in the form of amorphous carbon is also useable as material for the sacrificial layer.

In this regard, silicon oxide is often used as material for the sacrificial layer within a defined intermediate region and is dissolved or etched out of said intermediate region at the end of the process for producing the MEMS microphone. For MEMS microphones comprising two membrane structures, e.g. silicon membrane structures, the two membrane structures can be mechanically coupled to one another by means of mechanical connection elements, which are also referred to as columns or connection columns.

What can be achieved, then, in accordance with the concept according to the invention is that the mechanical connection elements or connection columns are not just resistant to the etchant, e.g. HF=hydrofluoric acid, and furthermore electrically insulating, but can moreover also be formed in relatively flexible fashion, i.e. with a low modulus of elasticity (Young's modulus). As a result, firstly, it is possible to achieve an extremely good acoustic behavior of the MEMS microphone with a high signal-to-noise ratio, wherein furthermore the required process steps for implementing the specially designed mechanical connection elements or connection columns can be integrated extremely simply into previous process sequences for MEMS components, such that the required additional outlay in the production process for corresponding MEMS components can be kept very low.

By forming the mechanical connection elements between the two membrane structures for the purpose of mechanically coupling same, it is possible to obtain both an extremely good acoustic behavior of the MEMS component with a very good electrical signal behavior resulting therefrom, and an extremely good mechanical protection for the intermediate region between the two membrane structures with the intervening counterelectrode structure (stator structure) of the MEMS component. The resulting electrical signal behavior can have an improved THD behavior (THD=Total Harmonic Distortion) by comparison with previous approaches and also an improved noise behavior (SNR).

The mechanical, e.g. columnar, connection elements can be formed in nonconductive fashion, for example, in order to be able to read the two membrane structures as different electrodes in differential operation. Furthermore, the number and size of the columnar connection elements, on the basis of the present concept, can be adapted extremely simply to the respective product requirements and thus be integrated extremely simply into previous process sequences.

Furthermore, the resulting flexibility of the mechanical connection elements can be set or adapted relatively exactly. Since the acoustic behavior of a MEMS microphone is very greatly dependent on the flexibility and compliance of the membrane structures, the resulting electrical signal behavior of a correspondingly constructed MEMS microphone can be adapted extremely exactly to desired setpoint parameters by virtue of the resulting flexibility of the double-membrane structure of the MEMS microphone being set exactly by means of the flexible connection elements.

To that end, in accordance with the present concept, the mechanical connection structure, i.e. the mechanical connection elements, will comprise a layer sequence comprising more than one material, wherein the layer material of the outer layer is resistant to the etchant, e.g. HF, while the inner material is formed in flexible fashion. Consequently, the inner material or medium is protected against ambient influences on account of the protective covering with the outer layer material.

In this regard, in accordance with one exemplary embodiment, the resulting flexibility of the columnar connection element can be set by a combination of the material properties of the coating material and of the filling material within the protective or cladding layer.

Since the coating material, i.e. the outer layer material forming a wall region, can be made relatively thin and can nevertheless fulfill the protection function vis-à-vis the surroundings, e.g. the etchant, it is possible, in one exemplary embodiment, for the resulting flexibility of the columnar connection element substantially to be predefined by the material properties of the filling material within the protective layer or the cladding layer.

In accordance with a further exemplary embodiment, by way of example, the inner volume region defined by the wall region formed with the first, outer material layer can be filled with the ambient atmosphere present during the process of sealing the inner volume region, such that the columnar, mechanical connection elements can also be formed as "hollow bodies" or empty sleeves, wherein the thickness and material properties of the outer material layer then predefine the resulting flexibility of the columnar mechanical connection element.

The basic sequence of the method 100 for producing a double-membrane MEMS component 200 (cf. FIG. 3a) comprising flexible mechanical connection elements such as e.g. connection columns, is now presented below by way of example with reference to schematic illustrations in FIGS. 1a-1d. In order to simplify the description of the geometric relationships, an x-y-z-coordinate system is furthermore illustrated by way of example in FIG. 1a, wherein the x-y-plane represents the plane of the drawing in FIGS. 1a-1d.

In the production method 100 for a double-membrane MEMS component 200, a step 120 involves firstly providing a layer arrangement 220 on a carrier substrate 222, e.g. a semiconductor or silicon substrate. The layer arrangement 220 comprises a first membrane structure 224, a sacrificial material layer 226 adjoining the first membrane structure 224, and a counterelectrode structure 228, which is also referred to as stator electrode or backplate, in the sacrificial material layer 226. The counterelectrode structure 228 is arranged at a distance from the first membrane structure 224 and in a manner embedded in the sacrificial material layer 226. In the sacrificial material layer 226 there is arranged at least one through opening 230-1 which extends for example from the first, i.e. exposed, main surface region 226-1 of the sacrificial material layer 226 or the layer arrangement 220 through the sacrificial material layer 226 as far as the first membrane structure 224 and is formed in a manner separated from the counterelectrode structure 228, i.e. without possible regions of contact with the counterelectrode structure 228.

The through opening 230 extending as far as the first membrane structure 224 thus has a surface area that is predefined or delimited by the sidewall 230-A and the exposed section 224-A of the first membrane structure 224.

As is illustrated in FIG. 1a, a plurality of further through openings 230-2, . . . 230-n are illustrated alongside the through opening 230-1, said further through openings being optionally provided in the layer arrangement 220. In the following description, reference is made to one through opening 230-1, although the explanations are equally applicable to further, optional through openings 230-2 . . . , 230-n.

The through opening 230-1 illustrated in FIG. 1a can have for example a cylindrical profile (in the y-direction), although the through opening 230-1 can also have a frustoconical profile or a funnel-shaped profile, i.e. in sections being frustoconical and transitioning to a cylindrical contour. The through opening 230-1 can furthermore also have an elliptical, oval or else rectangular cross section besides a circular cross section (with respect to the x-z-plane). Furthermore, the through opening 230-1 can also have at least in sections concave or convex outer contour sections (with respect to the x-z-plane) which are attributable for example to individual production processes, such as e.g. etching processes, for forming the through openings 230-n in the sacrificial material layer 226.

In accordance with exemplary embodiments, by way of example, the through opening 230-1 can be formed in columnar fashion, while the further, optional through opening 230-2 can be formed in a manner extending circumferentially, for example with a ring-shaped cross section (in the x-z-plane). As will also be described below, within the ring-shaped contour of the through opening 230-2 a so-called "ventilation or equalizing opening" can be defined and formed in the double-membrane structure of the MEMS component 200. The further, optional through openings 230-n can in turn be formed in columnar fashion.

Further optional elements of the layer arrangement 220 which are indicated by way of example in FIG. 1a are discussed below.

As is illustrated in FIG. 1a, by way of example, the first membrane structure 224 can have a so-called "segmentation" 232, wherein the term segmentation denotes a subdivision or demarcation of two regions of the membrane structure by means of an insulating layer arrangement. By means of a segmentation arranged e.g. in a manner extending circumferentially in the membrane structure, the membrane structure of a MEMS microphone can be electrically isolated, wherein the deflectable region of the membrane is arranged in a first region and the second region is situated for example in the holding structure situated at the edge. Parasitic effects, such as e.g. parasitic capacitances, can be significantly reduced by means of the segmentation of the membrane structures. However, the segmentation 232 illustrated in FIG. 1a should be regarded merely as optional.

FIG. 1a furthermore illustrates optional elevations 234, which can be formed as corrugations or anti-sticking elements. Corrugations can be provided for stress compensation in the respective layer, while anti-sticking elements or elevations, also referred to as "anti-sticking bumps", can be provided in order to prevent, during operation of the finished produced MEMS microphone, "large-area" sticking or touching of layer structures that are deflectable with respect to one another, such as e.g. a deflectable membrane structure with respect to the counterelectrode structure. These anti-sticking structures 234 can also be advantageous when clearing or etching free the sacrificial material layer in order to prevent mutual sticking of adjacent layer structures.

The depressions 236 further illustrated as optional in FIG. 1a can be provided in the first main surface region 226-1 of the sacrificial material layer 226 in the present process stage in the present process sequence, in order subsequently to produce, in further process steps, corresponding corrugation elements and/or anti-sticking elements in the second membrane structure (not shown in FIG. 1a) to be arranged in the later process sequence, wherein said corrugation elements and/or anti-sticking elements can have the function of the elements 234 that has already been described above.

In accordance with exemplary embodiments, provision can furthermore be made of further layers (not shown in FIGS. 1a-1d) as intermediate layers, insulating layers, insulating layers with embedded conductor tracks and/or else passivation layers. By way of example, a nitride material can be used as an etchant-resistant material for the further layers. Further intermediate layers can be provided for example for anchoring the membrane structures and counterelectrode structure at the edge region (not shown in FIG. 1a), while conductor tracks embedded in insulating layers can be provided for contacting the membrane structures and counterelectrode structure.

In a step 140, a filling material structure 240 can then be formed in the columnar through opening 230-1 and/or in the further optional through openings 230-2, 230-n by arranging a material layer 242 comprising a first filling material on the lateral wall region 230-A of the through openings 230-1 and/or of the further optional through openings 230-2, 230-n and on the exposed surface region 224-A of the first membrane structure 224, in order to obtain an inner volume region 244 in the through opening 230-1 adjoining the first filling material 242.

As is illustrated in FIG. 1b, the material layer 242 of the filling material structure 240 is formed in a manner offset somewhat by a distance Δy with respect to the main surface region 226-1 of the sacrificial material layer 226, wherein this should be assumed merely as by way of example and will be explained in even more detail on the basis of the subsequent exemplary embodiments with reference to FIGS. 2a-2b.

As is illustrated in FIG. 1b, in accordance with one exemplary embodiment, the filling material structure 240 can be formed as a hollow body or empty tube.

In accordance with one exemplary embodiment, a second filling material 246 can also be introduced into the inner volume region 244 in order to obtain the filling material structure 240, wherein the second filling material 246 is different than the first filling material 242.

In this regard, in accordance with one exemplary embodiment, the resulting flexibility of the columnar connection element can be set by a combination of the material properties of the coating material and the material properties of the filling material or filling medium within the protective or cladding layer.

In accordance with one exemplary embodiment, furthermore a layer sequence comprising a plurality of filling material layers can also be introduced into the inner volume region 244 (not shown in FIG. 1b) in order to obtain the filling material structure 240. In this case, at least one of the further filling material layers comprises a second filling material different than the first filling material 242.

In accordance with one exemplary embodiment, the first filling material has a higher modulus of elasticity than the second filling material 246. In this regard, by way of example, the first filling material 242 can comprise a nitride material, e.g. silicon nitride, wherein the second filling material 246 can comprise e.g. an oxide material, e.g. silicon oxide.

In a manner corresponding to the configuration of the through opening 230-n through the sacrificial material 226, the resulting filling material structure 240 between the first and second membrane structures 224, 250 can be formed as columnar, e.g. convex, cylindrical or, at least in sections, conical and cylindrical, i.e. funnel-shaped.

In FIG. 1c and the subsequent figures, the reference signs for the optional elements described above have not been depicted again, in order to make the illustrations clearer.

As is illustrated by way of example in FIG. 1c, a step 160 then involves applying or depositing a second membrane structure 250 on the layer arrangement 220, i.e. on the first main surface region 226-1 of the sacrificial layer 226 and furthermore the filling material structure 240, in order to hermetically seal the inner volume region 244 of the filling material structure 240 vis-à-vis the surroundings. As is furthermore illustrated in FIG. 1c, the material of the deposited second membrane structure 250 can extend into the through opening(s) 230-1 ( . . . 230-n) and terminate flush or in a positively locking manner with the material layer 242 of the filling material structure 240, in order to obtain the hermetic "sealing" of the inner volume region 244.

As is furthermore illustrated by way of example in FIG. 1c, a further, optional layer 252, e.g. an insulating or protective layer, can be provided on the second membrane structure 250. Furthermore, FIG. 1c illustrates access openings 254, which can be provided in a subsequent etching step as access openings for the etchant to the sacrificial material 226 in the intermediate region 238.

As is furthermore illustrated by way of example in FIG. 1c, the counterelectrode structure 228 is thus arranged in the intermediate region 238, filled with the sacrificial material 226, between the first and second membrane structures 224, 250, wherein the counterelectrode structure 228 is arranged for example equidistantly (centrally) between the first and second membrane structures 224, 250 and furthermore laterally at a distance from the filling material structure 240.

As is illustrated in FIG. 1d, a subsequent step 180 then involves removing the sacrificial material 226 from the intermediate region 238 in order to expose the filling material structure(s) 240 between the first and second membrane structures 224, 250 in the intermediate region 238, in order to obtain at least one mechanical connection element 240 between the first and second membrane structures 224, 250, wherein the mechanical connection element 240 is mechanically coupled between the first and second membrane structures 224, 250, i.e. is mechanically connected to the first and second membrane elements 224, 250, and is mechanically decoupled from the counterelectrode structure 228.

In accordance with one exemplary embodiment, provision can furthermore be made of further layers (not shown in FIGS. 1a-1d) as intermediate layers, insulating layers, insulating layers with embedded conductor tracks and/or else passivation layers (protective layers). By way of example, a nitride material can be used as an etchant-resistant material for further layers. Further intermediate layers can be provided for example for anchoring the membrane structure and counterelectrode structure, while conductor tracks embedded in insulating layers can be provided for electronically contacting the first and second membrane structures and the counterelectrode structure. A passivation layer can be provided as a protective layer, wherein for example conductive contact elements can furthermore be provided in order to provide electrical contacting regions for the membrane structures and/or the counterelectrode structure. The mechanical anchoring of the membrane structure and the counterelectrode structure to the carrier substrate is carried out for example in an edge region (not shown in FIGS. 1a-1d) of the layer arrangement 220.

In accordance with exemplary embodiments, the sacrificial layer 226 can comprise an oxide material, such as e.g. silicon oxide. One exemplary etchant can then be vHF (vHF=vapor HF) for an etching process. In accordance with exemplary embodiments, the first and second membrane structures and the counterelectrode structure can comprise a semiconductor material, such as e.g. polycrystalline or monocrystalline silicon or else silicon-germanium SiGe. Exemplary etchants can comprise $XeF_2$, HCL, $HNO_3$+HF, KOH, EDP or TMAH for a wet-etching process.

In accordance with exemplary embodiments, the sacrificial layer 226 can for example also comprise carbon, e.g. in the form of amorphous carbon. One exemplary etchant can then be oxygen, e.g. as $O_2$ plasma, for an ashing process.

With regard to the step of removing 180 the sacrificial material, i.e. etching free the movable sections of the first and second membrane structures 224, 250, it is pointed out that regions of the sacrificial material 226 can be maintained in an edge region of the layer arrangement 220 and can be effective for example as a mechanical bearing or support structure for the first and second membrane structures and the counterelectrode structure situated therebetween.

Step 180 of removing the sacrificial material 226 in the intermediate region 238 can be carried out for example by means of an isotropic wet or else dry-etching process using an etchant, wherein the etchant has an etching rate which is higher for the sacrificial material 226 than for the first filling material 242, which is exposed to the etching material, at least by a factor of 5, 10 or 20.

A description will now be given below of exemplary embodiments of the production steps of the production method 100 for the double-membrane MEMS component 200 in order to obtain the layer arrangement 220 present in the step of providing 120. In accordance with one exemplary embodiment, the basic method steps presented below can be carried out for example before the step of providing 120 the layer arrangement 200.

In this regard, firstly the first membrane structure 224 in the form of a first membrane layer or a first membrane layer stack can be formed or applied on the carrier substrate 222, e.g. a semiconductor substrate, or an insulating layer arranged thereon, e.g. comprising the sacrificial material. The step of forming the first membrane structure 224 can be carried out for example by means of a deposition process. Sacrificial material 226 can subsequently be applied on the first membrane structure 224. Afterward, the counterelectrode structure 228 in the form of a counterelectrode layer or a counterelectrode layer stack can be applied or deposited in a structured manner on the applied sacrificial material 226. Further sacrificial material 226 can subsequently be applied on the counterelectrode structure 228. Afterward, the at least one through opening 230-$n$ is introduced into the sacrificial material 226 as far as the first membrane structure 224 and in a manner separated from the counterelectrode structure 228. The step of introducing the at least one columnar through opening 230-$n$ into the sacrificial material 226 can be carried out for example by means of an anisotropic etching process, wherein the first membrane structure 224 is effective for example as an etch stop layer for this etching process. During the process of introducing or subsequently to the process of introducing the at least one through opening into the sacrificial material 226 as far as the membrane structure and before the process of forming the filling material structure, it is possible furthermore to carry out a process of incipiently etching the region of the first membrane structure that is exposed in the through opening, i.e. in the region of the at least one through opening, in order to obtain a depression in the material of the membrane structure 224 in the region of the at least one through opening. This process of incipiently etching the first membrane structure can be effective during the subsequent process of introducing the filling material structure 240 into the at least one columnar through opening to the effect that the mechanical connection of the filling material structure 240 to the first membrane structure is supported, i.e. an improved mechanical connection between the filling material structure 240 and the first membrane structure is obtained.

As has already been indicated above, the step of introducing a through opening into the sacrificial material layer 226 can also involve introducing a plurality of (e.g. columnar, linear or ring-shaped) through openings 230 $n$ into the sacrificial material 226 as far as the first membrane structure 224. The process of forming 140 the filling material structure 240 thus involves introducing filling material structures 240 respectively into the plurality of through openings 230-$n$, wherein the subsequent step of removing the sacrificial material involves exposing the filling material structure(s) in the plurality of through openings in order to obtain a plurality of mechanical connection elements 240 between the first and second membrane structures 224, 250, which are mechanically coupled between the first and second membrane structures 224, 250, i.e. are mechanically connected to same, and are mechanically decoupled from the counterelectrode structure 228.

As is illustrated in FIGS. 1a-4d, the through openings 230-1, . . . , 230-$n$ through the sacrificial material layer 226 or the filling material structures 240 arranged therein are arranged at a distance from the counterelectrode structure 228, such that no mechanical contact is made between the mechanical connection elements and the counterelectrode structure 228 in the event of a mechanical deflection of the first and second membrane structures coupled to one another during the operation of the double-membrane MEMS component 200. In a further subsequent step (not shown in FIGS. 1a-4d) a cavity can be introduced into the carrier substrate or semiconductor substrate 222 for example by means of a further etching process, e.g. a Bosch etching process, in order to expose at least the movable section of the membrane structure 224, 250.

In accordance with one exemplary embodiment, the first and second membrane structures 224, 250 can be hermetically sealed e.g. under a reduced atmospheric pressure or vacuum in order to generate a reduced atmospheric pressure or vacuum in the intermediate region between the first and second membrane structures of the double-membrane MEMS component. The intermediate region can then also be referred to as a low-pressure region, wherein the MEMS microphone can then also be referred to as a vacuum microphone.

The low-pressure region can thus have a pressure which can typically be lower than an ambient pressure or a standard atmospheric pressure to which the acoustic MEMS sensor is exposed e.g. under normal operating conditions, such as e.g. within a mobile device.

In accordance with one exemplary embodiment, the pressure in the low-pressure region can be substantially a vacuum or almost a vacuum. Alternatively, the pressure in the low-pressure region can be lower than approximately 50% (or 40%, 25%, 10% or 1%) of the ambient pressure or of the standard atmospheric pressure. The standard atmospheric pressure can typically be 101.325 kPa or 1013.25 mbar. The pressure in the low-pressure region can moreover be expressed as an absolute pressure, e.g. lower than 50, 40, 30, 10 or typically lower than 1 kPa.

By forming the mechanical connection elements between the two membrane structures for the purpose of mechanically coupling same and optionally by forming the low-pressure region described above, it is possible to obtain both an extremely good acoustic behavior of the MEMS component with a very good electrical signal behavior resulting therefrom, and an extremely good mechanical protection for the intermediate region between the two membrane structures with the intervening counterelectrode structure (stator structure) of the MEMS component. The resulting electrical signal behavior can have an improved THD behavior (THD=Total Harmonic Distortion) by comparison with previous approaches and also an improved noise behavior (SNR).

The mechanical, e.g. columnar, connection elements can be formed in nonconductive fashion, for example, in order to be able to read the two membrane structures as different electrodes in differential operation. Furthermore, the number and size of the columnar connection elements, on the basis of the present concept, can be adapted extremely simply to the respective product requirements and thus be integrated extremely simply into previous process sequences.

Furthermore, the resulting flexibility of the mechanical connection elements can be set or adapted relatively exactly. Since the acoustic behavior of a MEMS microphone is very greatly dependent on the flexibility and compliance of the membrane structures, the resulting electrical signal behavior of a correspondingly constructed MEMS microphone can be adapted extremely exactly to desired setpoint parameters by virtue of the resulting flexibility of the double-membrane structure of the MEMS microphone being set exactly by means of the flexible connection elements.

A description will now be given below, with reference to FIGS. 2a-2c, of exemplary embodiments of the production sections of the production method 100 for a double-membrane MEMS component 200 which are carried out for example between steps 120 and 140 from FIGS. 1a-4d in order to obtain the layer sequence comprising a first and second filling material 242, 246 that is obtained during the step of forming 140 the filling material structure(s) 240.

Figure 2B:
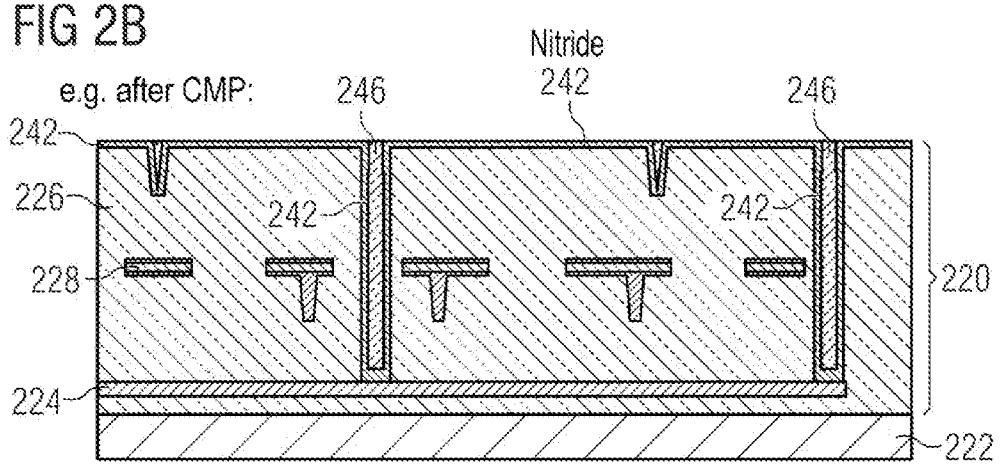

As is illustrated in FIG. 2a, firstly a relatively thin nitride layer 242 having a layer thickness of between 50 and 200 nm, between 130 and 150 nm, and typically approximately 140 nm, is formed on the first surface region 226-1 of the sacrificial material layer 226, on the wall region 230-A of the through opening(s) 230-1, . . . , 230-n and on the exposed surface section 224-A of the first membrane structure 224, wherein, by way of example, an LPCVD deposition of the nitride material (LPCVD=Low Pressure Chemical Vapor Deposition) can be used for this purpose. In conformal deposition processes, a uniform nitride layer 242, i.e. first filling material layer 242, can be introduced uniformly even into the relatively deep and narrow through openings 230-1, . . . , 230-n in the sacrificial material layer 226.

The through openings 230-1, . . . , 230-n in the sacrificial material layer 226 can have for example a diameter of 0.5 to 2.0 µm and a depth of 2 to 5 µm, which corresponds to the distance between the first and second membrane structures 224, 250.

Afterward, as is illustrated in FIG. 2a, using TEOS (tetraethyl orthosilicate) an oxide layer 246 having a thickness of 200 nm to 1.5 am, 300 to 900 nm or approximately 500 nm can be applied and respectively introduced on the first main surface region 226-1 of the sacrificial material layer 226 and into the through opening(s) 230-1, . . . , 230-n as the second filling material 246. Afterward, by way of example, the oxide material 246 is removed from the first surface region 226-1 of the layer arrangement 220, wherein, by way of example, a CMP process (CMP=Chemically Mechanically Polishing) can be used for this purpose. The resulting layer arrangement 220 is illustrated in FIG. 2b.

Figure 2C:
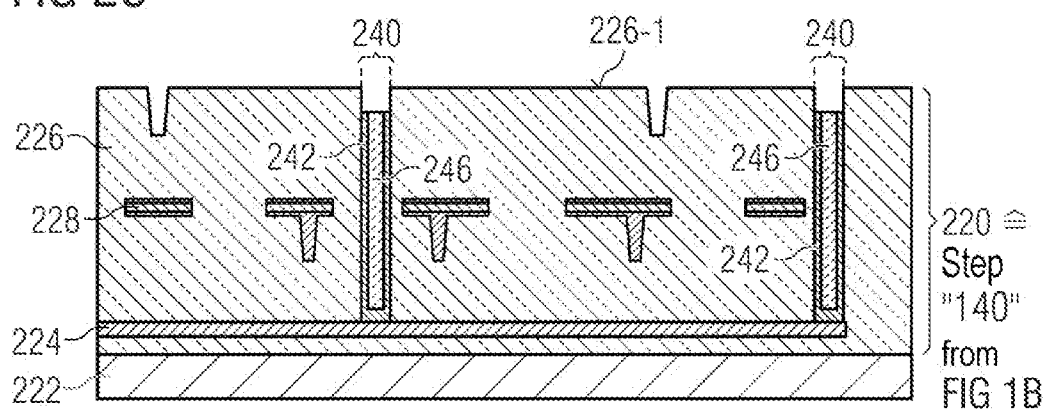

In a subsequent method step, which is illustrated by way of example in FIG. 2c, the nitride layer 246 arranged on the first surface region 226-1 is then removed, wherein the layer structures 240 formed in the through openings 230-1, . . . , 230-n and comprising the first and second filling materials 242, 246 as filling material structures 240 remain and the resulting layer arrangement 220, as illustrated in FIG. 2c, is obtained. The layer arrangement 220, illustrated only in sections in FIG. 2c, then corresponds to the layer arrangement 220 illustrated in FIG. 1c.

One exemplary embodiment of a double-membrane MEMS component 200 will now be described below with reference to FIG. 3a, wherein detail illustrations in the form of scanning electron microscope micrographs of the obtained filling material structure(s) 240 of a flexible connection element 24o are illustrated by way of example in FIGS. 3b-3e.

Figure 3A:
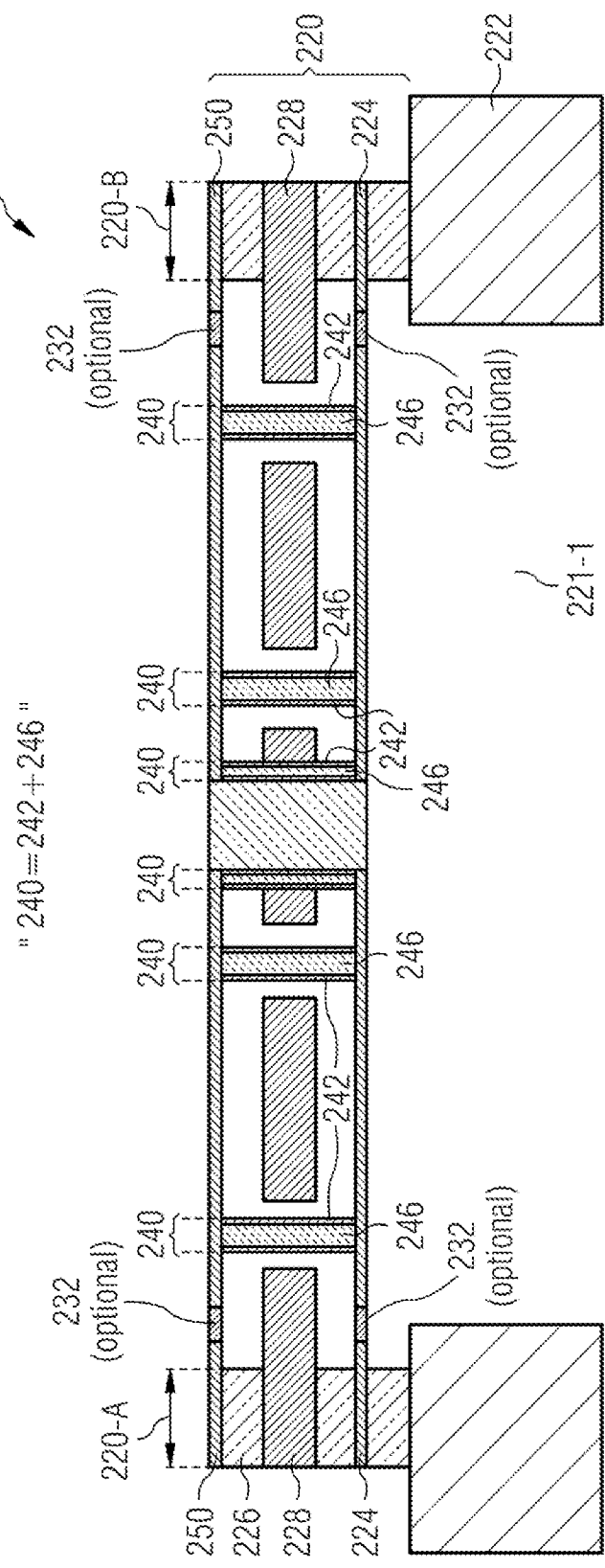
FIGS. 3a-3e show an exemplary, schematic illustration of a double-membrane MEMS component in accordance with one exemplary embodiment and exemplary schematic detail illustrations of the filling material structure of a flexible, columnar, mechanical connection element of the double-membrane MEMS component in accordance with one exemplary embodiment.

As is illustrated in FIG. 3a, the double-membrane MEMS component 200 comprises a layer arrangement 220 on a carrier substrate 222, wherein the layer arrangement 220 comprises a first and second membrane structure 224, 250 at a distance from one another and a counterelectrode structure 228 arranged therebetween, said counterelectrode structure being at a distance in each case from the first and second membrane structures 224, 250, and at least one mechanical connection element 240 between the first and second membrane structures 224, 250, which is mechanically coupled between the first and second membrane structures 224, 250 and is mechanically decoupled from the counterelectrode structure 228, wherein the at least one mechanical connection element 240 comprises a material structure 240 having a first filling material layer 242 as wall region of the mechanical connection element 240, wherein the filling material layer 242 formed as wall region forms an inner volume region 244 in the mechanical connection element 240, and wherein a medium or a second filling material 246 is arranged in the inner volume region 244 of the mechanical connection element 240, wherein the medium 246 has a lower modulus of elasticity than the material of the first filling material layer 242 forming the wall region.

In accordance with one exemplary embodiment, the mechanical connection element 240 can be formed as a hollow body or empty tube.

In accordance with one exemplary embodiment, a second filling material 246 can be arranged in the inner volume region 244, wherein the second filling material 246 is different than the material of the first filling material layer 242.

In accordance with one exemplary embodiment, the filling material structure 240 can comprise a layer sequence comprising a plurality of filling material layers 242, 246 in the inner volume region 244, wherein at least one further filling material layer 246 comprises a filling material different than the material of the first filling material layer 242.

In accordance with one exemplary embodiment, the material of the first filling material layer 242 can have a higher modulus of elasticity than the material of the further filling material layer 246.

In accordance with one exemplary embodiment, the first filling material layer 242 can comprise a nitride material, and wherein the second filling material layer can comprise an oxide material.

In accordance with one exemplary embodiment, the filling material structure 240 can be formed in frustoconical, cylindrical or funnel-shaped fashion between the first and second membrane structures 224, 250.

As is illustrated in FIG. 3a, the sacrificial material 226 is maintained in the edge region 220-A, 220-B of the layer arrangement 220 and is effective for example as a mechanical bearing or support structure for the first and second membrane structures 224, 250 and the counterelectrode structure 228 on the substrate 222. Furthermore, the substrate 222 can have a cavity 222-1 for exposing the movable section of the double-membrane structure 224, 250. As is illustrated in FIG. 3a, by way of example, the first and second membrane structures 224, 250 can have the optional segmentation 232.

The present concept is thus applicable to acoustic MEMS sensors, such as e.g. MEMS microphones, wherein, by way of example, a sequence of layers comprising materials such as e.g. poly/monosilicon, silicon nitride and silicon oxide is used in MEMS microphones. The silicon oxide material is usually used as a sacrificial layer and etched out of a defined region of the MEMS microphone at the end of the production process. For so-called "vacuum microphones", by way of example, two movable membrane structures 224, 250 are used, wherein a reduced atmospheric pressure is present in the interspace or the cavity between the two membranes 224, 250. In order to prevent the membrane structures from collapsing or curving inward, the mechanical connection elements 240, which are also referred to as columns, are used to keep a fixed interspace between the two membrane structures 224, 250. The connection elements 240 have e.g. the following properties. The mechanical connection elements can be formed in electrically insulating fashion between the membrane structures 224, 250 in order to enable a differential read-out process for the membrane structures 224, 250. Furthermore, the mechanical connection elements can be stable or resistant vis-à-vis the etching-free chemicals, e.g. vis-à-vis HF=hydrofluoric acid or other etchants, wherein the mechanical connection elements can be formed in relatively flexible fashion.

In accordance with the present concept, therefore, mechanical connection elements are provided as spacers between the two movable membrane structures, wherein said spacers can be formed in dielectric, etchant-stable and flexible fashion (with a low modulus of elasticity). This is realized by a multilayered configuration of the mechanical connection elements in accordance with the present concept, wherein the outermost layer or the wall region of the mechanical connection elements 240 is resistant to etchants, wherein the inner material or the empty space is formed in flexible fashion.

The double-membrane MEMS component 200 can be produced in accordance with the methods 100 described above, wherein the explanations there are equally applicable to the basic exemplary embodiment of the double-membrane MEMS component 200 as illustrated in FIG. 3a.

Figure 3B:
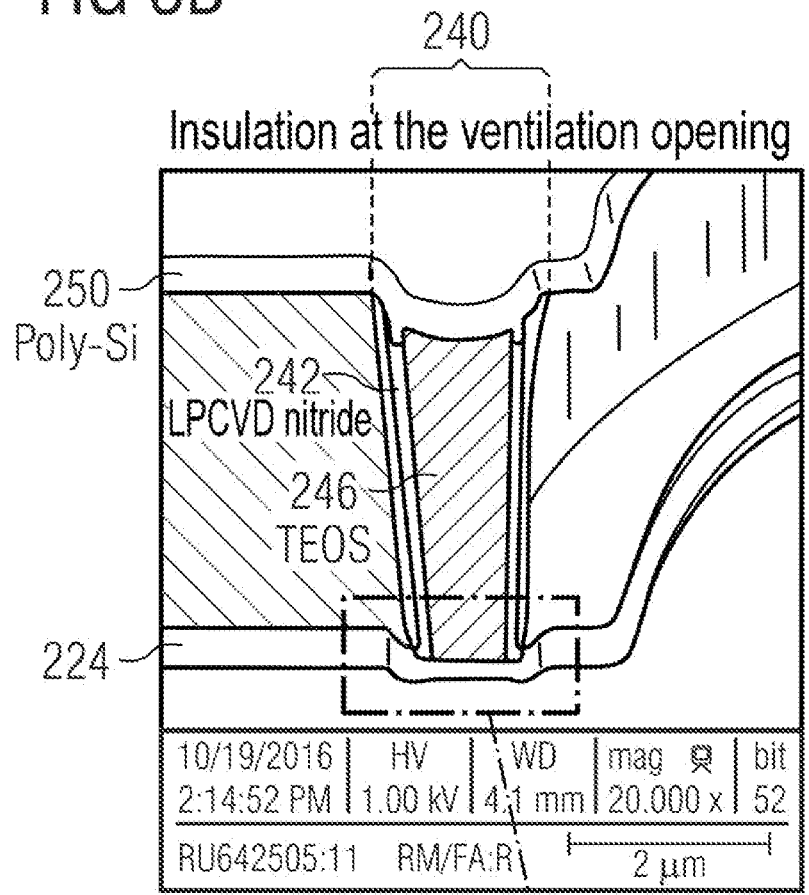

FIG. 3b then shows a detail illustration in the form of a scanning electron microscope image of the "circumferentially extending" mechanical connection element 240 or of the filling structure 240 around the ventilation opening 260 in the membrane structure 224, 250 of the double-membrane MEMS component 200. As is illustrated in FIG. 3b, the filling material structure 24o extends between the first membrane structure 224 and the second membrane structure 250, wherein the first filling material layer 242 is formed as a nitride layer, while the second filling material layer 246 comprises an oxide material. Furthermore, the positively locking mechanical connection between the filling material structure 240 and the second membrane structure 250 (poly-Si) can be seen in FIG. 3b.

Figure 3C:
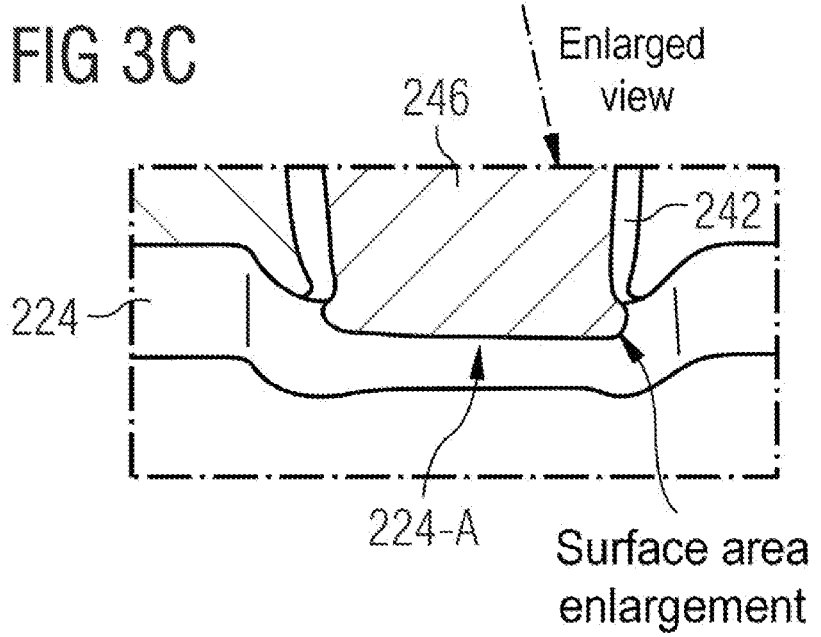

FIG. 3c then shows, in an enlarged partial illustration, the connection region of the filling material structure 240 from FIG. 3b with the first membrane structure 224. As can be seen in FIG. 3c, the first membrane structure 224 is additionally incipiently etched in the region of the through opening, i.e. in the region of the filling material structure 240, or was subjected to an overetch, thus resulting in an enlarged mechanical contact region 224-A between the filling material structure 240 and the first membrane structure 224, which contact region can lead to an improved mechanical connection between the connection element 240, i.e. the filling material structure 240, and the first membrane structure 224. In other words, overetching the polysilicon material of the first membrane structure 224, for example, results in a surface area enlargement or roughening of the material of the first membrane structure 224 in the contact region 224 A with the filling material structure 240, which leads to an improved mechanical anchoring of the filling material structure 240, i.e. of the mechanical connection element, with the first membrane structure 224.

Figure 3D:
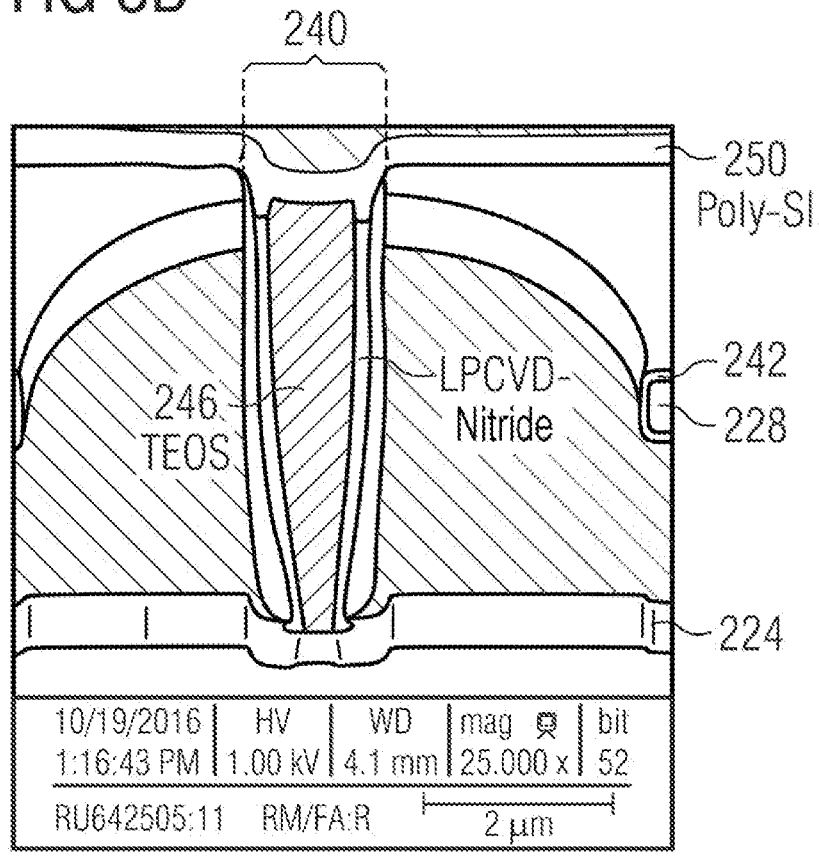

FIG. 3d then illustrates a columnar mechanical connection element between the first and second membrane structures 224 and 250, wherein the mechanical decoupling from the counterelectrode structure 228 situated therebetween is clearly illustrated.

Figure 3E:
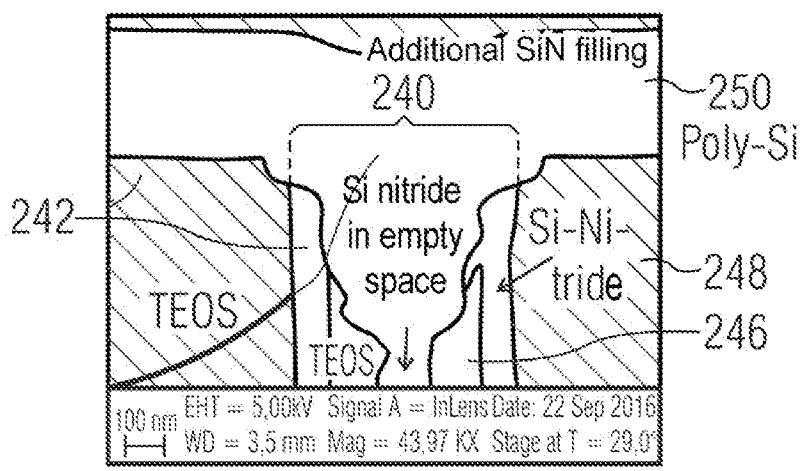

FIG. 3e then illustrates a detail view of a further exemplary filling material structure 240, wherein the filling material structure 240 can comprise a layer sequence comprising a plurality of filling material layers in the inner volume region 244, wherein, in the case of the layer sequence illustrated in FIG. 3e, the first filling material is once again a nitride material, the second filling material 246 adjacent thereto once again comprises an oxide material, wherein a third filling material 248, which for example once again comprises a nitride material, is arranged in the second filling material 246.

Additional exemplary embodiments and aspects of the invention are described, which can be used individually or in combination with the features and functionalities described herein.

In accordance with a first aspect, a production method 100 for a double-membrane MEMS component 200 can comprise the following steps: providing 120 a layer arrangement 220 on a carrier substrate 222, wherein the layer arrangement 220 comprises a first membrane structure 224, a sacrificial material layer 226 adjoining the first membrane structure 224, and a counterelectrode structure 228 in the sacrificial material layer 226 and at a distance from the first membrane structure 224, wherein in the sacrificial material layer 226 at least one through opening 230-1, . . . , 230-n is formed as far as the first membrane structure 224 and in a manner separated from the counterelectrode structure 228, forming 140 a filling material structure 240 in the through opening 230-n by applying a first filling material layer 242 on the wall region 230-A of the through opening 230-n in order to obtain an inner volume region 244 in the through opening 230-n adjoining the first filling material layer, applying 160 in a structured manner a second membrane structure 250 on the layer arrangement 220 with the sacrificial material 226 and the filling material structure 240 in order to hermetically seal the inner volume region 244, wherein the counterelectrode structure 228 is arranged in an intermediate region 238, filled with the sacrificial material 226, between the first and second membrane structures 224, 250 and in each case at a distance from same, and removing 180 the sacrificial material 226 from the intermediate region 238 in order to expose the filling material structure 240 in the intermediate region 238, in order to obtain at least one mechanical connection element 240 between the first and second membrane structures 224, 250, which is mechanically coupled between the first and second membrane structures 224, 250 and is mechanically decoupled from the counterelectrode structure 228.

In accordance with a second aspect referring back to the first aspect, the production method 100 can furthermore comprise the following step: introducing a second filling material 246 into the inner volume region 244 in order to obtain the filling material structure 240, wherein the second filling material 246 is different than the first filling material.

In accordance with a third aspect referring back to the first aspect, the production method 100 can furthermore comprise the following step: introducing a layer sequence comprising a plurality of filling material layers into the inner volume region 244 in order to obtain the filling material structure 240, wherein at least one further filling material layer comprises a second filling material different than the first filling material layer 242.

In accordance with a fourth aspect referring back to the second aspect, the material of the first filling material layer 242 can have a higher modulus of elasticity than the material of the second filling material layer 246.

In accordance with a fifth aspect referring back to the first aspect, the first filling material layer 242 can comprise a nitride material, and the second filling material layer 246 can comprise an oxide material.

In accordance with a sixth aspect referring back to the first aspect, the filling material structure 240 is formed in frustoconical, cylindrical or funnel-shaped fashion between the first and second membrane structures 224, 250.

In accordance with a seventh aspect referring back to the first aspect, step 180 of removing the sacrificial material 226 can be carried out by means of an isotropic etching process using a liquid or gaseous etchant, wherein the etchant can have an etching rate which is higher for the sacrificial material 226 than for the first filling material at least by a factor of 10.

In accordance with an eighth aspect referring back to the first aspect, before step 120 of providing the layer arrangement 220, the following steps for forming the layer arrangement 220 can be carried out: forming the first membrane structure 224 in the form of a first membrane layer or a first membrane layer stack on the carrier substrate 222, applying sacrificial material 226 on the first membrane structure 224, forming the counterelectrode structure 228 in the form of a counterelectrode layer or a counterelectrode layer stack on the applied sacrificial material 226, applying sacrificial material 226 on the counterelectrode structure 228, and introducing the at least one through opening 230 n into the sacrificial material 226 as far as the first membrane structure 224 and in a manner separated from the counterelectrode structure 228.

In accordance with a ninth aspect referring back to the eighth aspect, the step of introducing involves introducing a plurality of through openings into the sacrificial material 226 as far as the first membrane structure, wherein the filling material structure 240 is formed in the plurality of through openings 230-n, and wherein the step of removing the sacrificial material 226 can involve exposing the filling material structure 240 in the plurality of through openings 230-n in order to obtain a plurality of mechanical connection elements between the first and second membrane structures 224, 250, which are mechanically coupled between the first and second membrane structures 224, 250 and are mechanically decoupled from the counterelectrode structure 228.

In accordance with a tenth aspect referring back to the first aspect, the production method 100 can furthermore comprise the following step: incipiently etching the first membrane structure 224 in the region 224-a of the at least one through opening 230-n in order to obtain a depression in the material of the membrane structure 224 in the region of the at least one through opening 230-n, wherein the step of incipiently etching the membrane structure is performed during the process of introducing or subsequent to the process of introducing the at least one through opening into the sacrificial material 226 as far as the first membrane structure 224 and before the process of forming the filling material structure 240.

In accordance with an eleventh aspect referring back to the first aspect, the method 100 can further comprise the following step: hermetically sealing the first and second membrane structures under reduced atmospheric pressure or vacuum in order to generate a reduced atmospheric pressure or vacuum in the intermediate region between the first and second membrane structures of the double-membrane MEMS component.

In accordance with a twelfth aspect, a double-membrane MEMS component 200 can comprise the following features: a layer arrangement 220 on a carrier substrate 222, wherein the layer arrangement 220 comprises a first and second membrane structure 224, 250 at a distance from one another and a counterelectrode structure 228 arranged therebetween, said counterelectrode structure being at a distance in each case from the first and second membrane structures 224, 250, and at least one mechanical connection element 240 between the first and second membrane structures 224, 250, which is mechanically coupled between the first and second membrane structures 224, 250 and is mechanically decoupled from the counterelectrode structure 228, wherein the at least one mechanical connection element 240 comprises a material structure 24o having a first filling material layer 242 as wall region of the mechanical connection element 240, wherein the filling material layer 242 formed as wall region forms an inner volume region 244 in the mechanical connection element 240, and wherein a medium 246 is arranged in the inner volume region 244 of the mechanical connection element 240, wherein the medium 246 has a lower modulus of elasticity than the material of the first filling material layer 242 forming the wall region.

In accordance with a thirteenth aspect referring back to the twelfth aspect, the mechanical connection element 240 can be formed as a hollow body or empty tube.

In accordance with a fourteenth aspect referring back to the twelfth aspect, a second filling material 246 can be arranged in the inner volume region 244, wherein the second filling material 246 is different than the material of the first filling material layer 242.

In accordance with a fifteenth aspect referring back to the twelfth aspect, the filling material structure 240 can comprise a layer sequence comprising a plurality of filling material layers in the inner volume region 244, wherein at least one further filling material layer 246 comprises a filling material different than the material of the first filling material layer.

In accordance with a sixteenth aspect referring back to the twelfth aspect, the material of the first filling material layer can have a higher modulus of elasticity than the material of the further filling material layer.

In accordance with a seventeenth aspect referring back to the twelfth aspect, the first filling material layer 242 can comprise a nitride material, and the second filling material layer can comprise an oxide material.

In accordance with an eighteenth aspect referring back to the twelfth aspect, the filling material structure 240 can be formed in frustoconical, cylindrical or funnel-shaped fashion between the first and second membrane structures 224, 250.

Although some aspects have been described in connection with a method for producing a buried cavity structure in a monocrystalline semiconductor substrate, it goes without saying that these aspects also constitute a description of the corresponding device for producing a buried cavity structure in a monocrystalline semiconductor substrate, such that a method step or a feature of a method step should also be understood as a corresponding block or a component of a corresponding device. Some or all of the method steps can be carried out by a hardware apparatus (or using a hardware apparatus), such as using a microprocessor, a programmable computer or an electronic circuit. In some exemplary embodiments, some or a plurality of the most important method steps can be performed by such an apparatus.

The exemplary embodiments described above merely represent an illustration of the principles of the present exemplary embodiments. It goes without saying that modifications and variations of the arrangements and details described herein will be apparent to others skilled in the art. Therefore, the intention is for the exemplary embodiments to be restricted only by the scope of protection of the following patent claims and not by the specific details that have been presented on the basis of the description and the explanation of the exemplary embodiments herein.

What is claimed is:

1. A double-membrane MEMS component, comprising:
a layer arrangement on a carrier substrate, wherein the layer arrangement comprises a first and second membrane structure at a distance from one another and a counterelectrode structure arranged therebetween, said counterelectrode structure being at a distance in each case from the first and second membrane structures; and
at least one mechanical connection element between the first and second membrane structures, the at least one mechanical connection element mechanically coupled between the first and second membrane structures and mechanically decoupled from the counterelectrode structure, wherein the at least one mechanical connection element comprises a material structure having a first filling material layer as a wall region of the mechanical connection element, wherein the first filling material layer formed as the wall region forms an inner volume region in the mechanical connection element, wherein a medium is arranged in the inner volume region of the mechanical connection element, and wherein the medium has a lower modulus of elasticity than the material of the first filling material layer forming the wall region,
wherein the medium comprises a second filling material arranged in the inner volume region, and wherein the second filling material is different from the material of the first filling material layer.

2. The double-membrane MEMS component as claimed in claim 1, wherein the mechanical connection element is formed as a hollow body or empty tube.

3. The double-membrane MEMS component as claimed in claim 1, wherein the material structure comprises a layer sequence comprising a plurality of filling material layers in the inner volume region, and wherein at least one further filling material layer comprises a filling material different than the material of the first filling material layer.

4. The double-membrane MEMS component as claimed in claim 3, wherein the material of the first filling material layer has a higher modulus of elasticity than the material of the further filling material layer.

5. The double-membrane MEMS component as claimed in claim 1, wherein the first filling material layer comprises a nitride material, and wherein the second filling material comprises an oxide material.

6. The double-membrane MEMS component as claimed in claim 1, wherein the material structure is formed in frustoconical, cylindrical or funnel-shaped fashion between the first and second membrane structures.

7. A double-membrane MEMS component, comprising:
a layer arrangement on a carrier substrate, wherein the layer arrangement comprises a first and second membrane structure at a distance from one another and a counterelectrode structure arranged therebetween, said counterelectrode structure being at a distance in each case from the first and second membrane structures; and
at least one mechanical connection element between the first and second membrane structures, the at least one mechanical connection element mechanically coupled between the first and second membrane structures and mechanically decoupled from the counterelectrode structure, wherein the at least one mechanical connection element comprises a material structure having a first filling material layer as a wall region of the mechanical connection element, wherein the first filling material layer formed as the wall region forms an inner volume region in the mechanical connection element, and wherein a one-to-one relationship exists between a total number of mechanical connection elements and a total number of openings in the counterelectrode structure between a first edge region and a second edge region of the layer arrangement, wherein a second filling material is arranged in the inner volume region, and wherein the second filling material is different from the material of the first filling material layer.

8. The double-membrane MEMS component as claimed in claim 7, wherein the mechanical connection element is formed as a hollow body or empty tube.

9. The double-membrane MEMS component as claimed in claim 7, wherein the material structure comprises a layer sequence comprising a plurality of filling material layers in the inner volume region, and wherein at least one further filling material layer comprises a filling material different than the material of the first filling material layer.

10. The double-membrane MEMS component as claimed in claim 9, wherein the material of the first filling material layer has a higher modulus of elasticity than the material of the further filling material layer.

11. The double-membrane MEMS component as claimed in claim 7, wherein the first filling material layer comprises a nitride material, and wherein the second filling material comprises an oxide material.

12. The double-membrane MEMS component as claimed in claim 7, wherein the material structure is formed in frustoconical, cylindrical or funnel-shaped fashion between the first and second membrane structures.

13. A double-membrane MEMS component, comprising:
a layer arrangement on a carrier substrate, wherein the layer arrangement comprises a first and second membrane structure at a distance from one another and a counterelectrode structure arranged therebetween, said counterelectrode structure being at a distance in each case from the first and second membrane structures; and
at least one mechanical connection element between the first and second membrane structures, the at least one mechanical connection element mechanically coupled between the first and second membrane structures and mechanically decoupled from the counterelectrode structure, wherein the at least one mechanical connection element comprises a material structure having a first filling material layer as a wall region of the mechanical connection element, wherein the first filling material layer formed as the wall region forms an inner volume region in the mechanical connection element, and wherein the first membrane, the second membrane, and the counterelectrode are laterally symmetrical with respect to a central sacrificial material structure, wherein the central sacrificial material structure is vertically arranged between the first and second membrane structures and wherein the central sacrificial material structure is horizontally arranged to have at least a portion located halfway between a first edge portion and a second edge portion of the layer arrangement, wherein a second filling material is arranged in the inner volume region, and wherein the second filling material is different from the material of the first filling material layer.

14. The double-membrane MEMS component as claimed in claim 13, wherein the mechanical connection element is formed as a hollow body or empty tube.

15. The double-membrane MEMS component as claimed in claim 13, wherein the material structure comprises a layer sequence comprising a plurality of filling material layers in the inner volume region, and wherein at least one further filling material layer comprises a filling material different than the material of the first filling material layer.

16. The double-membrane MEMS component as claimed in claim 15, wherein the material of the first filling material layer has a higher modulus of elasticity than the material of the further filling material layer.

17. The double-membrane MEMS component as claimed in claim 13, wherein the first filling material layer comprises a nitride material, and wherein the second filling material comprises an oxide material.

18. The double-membrane MEMS component as claimed in claim 13, wherein the material structure is formed in frustoconical, cylindrical or funnel-shaped fashion between the first and second membrane structures.

* * * * *